United States Patent
Kobayashi

(10) Patent No.: US 10,050,031 B2
(45) Date of Patent: Aug. 14, 2018

(54) POWER CONVENTER AND SEMICONDUCTOR DEVICE

(71) Applicant: SHINDENGEN ELECTRIC MANUFACTURING CO., LTD., Tokyo (JP)

(72) Inventor: Yoshinori Kobayashi, Hanno-shi (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/545,179

(22) PCT Filed: Aug. 28, 2015

(86) PCT No.: PCT/JP2015/074418
§ 371 (c)(1),
(2) Date: Jul. 20, 2017

(87) PCT Pub. No.: WO2017/037780
PCT Pub. Date: Mar. 9, 2017

(65) Prior Publication Data
US 2018/0006018 A1 Jan. 4, 2018

(51) Int. Cl.
*H01L 27/06* (2006.01)
*G01K 7/22* (2006.01)
(Continued)

(52) U.S. Cl.
CPC .......... *H01L 27/0629* (2013.01); *G01K 7/22* (2013.01); *H02M 3/158* (2013.01)

(58) Field of Classification Search
CPC ..... H01L 27/0629; G01K 7/22; H02M 3/158; H02M 2001/0009; H02M 1/32; H02M 2001/327
See application file for complete search history.

(56) References Cited

U.S. PATENT DOCUMENTS

2017/0328786 A1* 11/2017 Takechi ............... G01K 7/22
2018/0034446 A1* 2/2018 Wood ................. H03H 11/28
2018/0048141 A1* 2/2018 Suzuki ................ H02H 3/085

FOREIGN PATENT DOCUMENTS

JP     2005-286270 A     10/2005
JP     2008-113509 A     5/2008
(Continued)

OTHER PUBLICATIONS

International Search Report for Application No. PCT/JP2015/074418, dated Dec. 1, 2015 (2 pages).
(Continued)

*Primary Examiner* — Timothy J Dole
*Assistant Examiner* — Sisay G Tiku
(74) *Attorney, Agent, or Firm* — Nutter McClennen & Fish LLP; John J. Penny, Jr.

(57) ABSTRACT

A power converter includes a semiconductor element disposed on a substrate, a thermistor element for detecting the temperature of the substrate, the thermistor element being disposed on the substrate, a current detection resistor having one end connected to a ground side node and another end that is grounded, a first voltage detection unit configured to detect a first potential at the other end of the current detection resistor and a second potential at the ground side node, and output a first detection signal, a control unit configured to control the semiconductor element based on the first detection signal, a temperature detection resistor having one end that is connected to a reference potential and another end that is connected to a detection node, and a temperature detection unit configured to detect a temperature based on a third potential at the detection node, and output a temperature information signal.

12 Claims, 6 Drawing Sheets

(51) Int. Cl.
*H02M 3/158* (2006.01)
*H02M 1/00* (2006.01)
*H02M 1/32* (2007.01)

(56) References Cited

FOREIGN PATENT DOCUMENTS

| | | |
|---|---|---|
| JP | 2012-249482 A | 12/2012 |
| JP | 2013-026010 A | 2/2013 |
| JP | 2015-015348 A | 1/2015 |

OTHER PUBLICATIONS

International Preliminary Report on Patentability for Application No. PCT/JP2015/074418, dated Mar. 15, 2018 (7 Pages).

\* cited by examiner

POWER CONVENTER AND SEMICONDUCTOR DEVICE

The present application claims priority under 35 U.S.C. § 365 to PCT/JP2015/074418, filed on Aug. 28, 2015, the disclosure of which are incorporated herein by reference.

TECHNICAL FIELD

The present invention relates to power converters and semiconductor devices.

BACKGROUND ART

Power converters including a power module such as a MOSFET disposed on a substrate are known (for example, JP 2013-26010 A and JP 2008-113509 A).

Such a power converter 100A includes transistors Q1 to Q4, a thermistor element TH for measuring the temperature of a substrate X, a temperature detection unit TDC for detecting the temperature of the thermistor element, a voltage detection unit VC for detecting the voltage of a resistor RI, and a control unit CON for controlling the transistors Q1 to Q4 (FIG. 6).

The thermistor element TH is disposed on the substrate X together with the transistors Q1 to Q4. One end of the thermistor element TH is connected to the temperature detection unit TDC via a node ND1 of the substrate X, and another end of the thermistor element TH is grounded via a node ND2 of the substrate X (FIG. 6).

A temperature corresponding to the resistance value of the thermistor element TH is detected based on the voltage detected by the temperature detection unit TDC.

The conventional power converter 100A described above needs to have the independent two nodes ND1 and ND2 on the substrate X in order to detect the voltage of the thermistor element TH on the substrate X.

This causes a problem in the power converter 100A in that manufacturing costs may be increased due to an increase in the number of nodes (the two nodes ND1 and ND2 in FIG. 6) of the substrate X used to detect the voltage of the thermistor element TH on the substrate X.

SUMMARY OF THE INVENTION

Problem to be Solved by the Invention

It is an object of the present invention to provide a power converter capable of reducing the number of nodes on the substrate, thereby reducing the manufacturing costs.

Solution to Problem

A power converter according to an embodiment in an aspect of the present invention includes:

a semiconductor element disposed on a substrate, the semiconductor element including an output connected to an output node of the substrate, a first input connected to a first control node of the substrate, a second input connected to a second control node of the substrate, a first drive current node connected to a power supply side node of the substrate, and a second drive current node connected to a ground side node of the substrate;

a thermistor element disposed on the substrate for detecting a temperature of the substrate, the thermistor element having one end that is connected to the ground side node, and another end that is connected to a detection node of the substrate;

a current detection resistor having one end that is connected to the ground side node and another end that is grounded;

a first voltage detection unit configured to detect a first potential at the other end of the current detection resistor and a second potential at the ground side node, and output a first detection signal in accordance with a first potential difference between the first potential and the second potential;

a control unit configured to output, based on the first detection signal, a first control signal to the first input via the first control node and a second control signal to the second input via the second control node to control the semiconductor element;

a temperature detection resistor having one end that is connected to a reference potential, and another end that is connected to the detection node; and a temperature detection unit configured to detect a temperature based on a third potential at the detection node, and output a temperature information signal including information on the temperature detected.

In the power converter,
the semiconductor element includes:
a first transistor having one end that is the first drive current node, another end connected to the output, and a gate that is the first input; and
a second transistor having one end that is connected to the output, another end that is the second drive current node, and a gate that is the second input,
and
based on the first detection signal, the control unit outputs the first control signal to the gate of the first transistor via the first control node to control the first transistor, and the second control signal to the gate of the second transistor via the second control node to control the second transistor.

In the power converter,
the temperature detection unit receives the third potential at the detection node and the first detection signal, and obtains a resistance value of the thermistor element based on the third potential and the first potential difference to detect a temperature corresponding to the resistance value of the thermistor element.

In the power converter,
the temperature detection unit obtains:
a second potential difference by subtracting the first potential difference from a potential difference between the third potential and a ground potential;
a current value of a current flowing through the thermistor element by dividing a potential difference between the reference potential and the third potential by a resistance value of the temperature detection resistor; and
the resistance value of the thermistor element by dividing the second potential difference by the current value.

The power converter further includes a second voltage detection unit configured to detect the second potential at the ground side node and the third potential at the detection node, and
the temperature detection unit:
receives a signal including information on the second potential and the third potential from the second voltage detection unit;
obtains a resistance value of the thermistor element based on the third potential and the second potential; and
detects a temperature corresponding to the resistance value of the thermistor element.

In the power converter,
the temperature detection unit obtains:
a second potential difference between the third potential and the second potential;
a current value of a current flowing through the thermistor element by dividing a potential difference between the reference potential and the third potential by a resistance value of the temperature detection resistor; and
a resistance value of the thermistor element by dividing the second potential difference by the current value of the current flowing through the thermistor element.

The power converter further includes a second voltage detection unit configured to detect the first potential at the current detection resistor and the third potential at the detection node, and
the temperature detection unit:
receives a signal including information on the first potential and the third potential from the second voltage detection unit; and
obtains a resistance value of the thermistor element based on the first potential and the third potential, and detects a temperature corresponding to the resistance value of the thermistor element.

In the power converter,
the temperature detection unit obtains:
a potential difference between the third potential and the first potential;
a current value of a current flowing through the thermistor element by dividing a potential difference between the reference potential and the third potential by a resistance value of the temperature detection resistor; and
a resistance value of the thermistor element by dividing the potential difference between the third potential and the first potential by the current value.

The power converter further includes a second voltage detection unit configured to detect the first potential at the other end of the current detection resistor and the third potential at the detection node, and
the temperature detection unit:
receives a signal including information on the first potential and the third potential from the second voltage detection unit and the first detection signal;
obtains a resistance value of the thermistor element based on the first potential, the third potential, and the first potential difference; and
detects a temperature corresponding to the resistance value of the thermistor element.

In the power converter,
the temperature detection unit obtains:
a second potential difference by subtracting the first potential difference from a potential difference between the third potential and the first potential;
a current value of a current flowing through the thermistor element by dividing a potential difference between the reference potential and the third potential by a resistance value of the temperature detection resistor; and
a resistance value of the thermistor element by dividing the second potential difference by the current value.

In the power converter,
a resistance value of the temperature detection resistor is greater than a resistance value of the current detection resistor, and a resistance value of the thermistor element at a normal temperature is greater than the resistance value of the temperature detection resistor.

In the power converter,
the control unit:
obtains a first current flowing through the current detection resistor based on the first detection signal; and
based on a value of the first current, outputs the first control signal to the gate of the first transistor via the first control node to control the first transistor, and the second control signal to the gate of the second transistor via the second control node to control the second transistor.

In the power converter,
the first transistor is a first NMOS transistor having a drain that is the one end of the first transistor, the drain being connected to the power supply side node, and a source that is the other end of the first transistor, the source being connected to the output node; and
the second transistor is a second NMOS transistor having a drain that is the one end of the second transistor, the drain being connected to the output node, and a source that is the other end of the second transistor, the source being connected to the ground side node.

In the power converter,
the power supply node is connected to a power supply potential.

A semiconductor device according to an embodiment in an aspect of the present invention includes:
a semiconductor element disposed on a substrate, including an output connected to an output node of the substrate, a first input connected to a first control node of the substrate, a second input connected to a second control node of the substrate, a first drive current node connected to a power supply side node of the substrate, and a second drive current node connected to a ground side node of the substrate; and
a thermistor element for detecting a temperature of the substrate, the thermistor element being disposed on the substrate and having one end that is connected to the ground side node and another end that is connected to a detection node of the substrate.

Effects of Invention

A power converter in an aspect of the present invention includes:
a semiconductor element disposed on a substrate, the semiconductor element including an output connected to an output node of the substrate, a first input connected to a first control node of the substrate, a second input connected to a second control node of the substrate, a first drive current node connected to a power supply side node of the substrate, and a second drive current node connected to a ground side node of the substrate;
a thermistor element disposed on the substrate for detecting a temperature of the substrate, the thermistor element having one end that is connected to the ground side node, and another end that is connected to a detection node of the substrate;
a current detection resistor having one end that is connected to the ground side node and another end that is grounded;
a first voltage detection unit configured to detect a first potential at the other end of the current detection resistor and a second potential at the ground side node, and output a first detection signal in accordance with a first potential difference between the first potential and the second potential;
a control unit configured to output, based on the first detection signal, a first control signal to the first input via the first control node and a second control signal to the second input via the second control node to control the semiconductor element;

a temperature detection resistor having one end that is connected to a reference potential, and another end that is connected to the detection node; and a temperature detection unit configured to detect a temperature based on a third potential at the detection node, and output a temperature information signal including information on the temperature detected.

Thus, in the power converter, the other end of the thermistor element is connected to the ground side node so that a node of the substrate that is grounded to detect the voltage of the thermistor element is used as the ground side node to which the current detection resistor for detecting the current flowing through semiconductor element (the first and second transistors) is connected.

This leads to a reduction in the number of nodes of the substrate used for detecting the voltage of the thermistor element.

Thus, the number of nodes in the substrate may be decreased to reduce the manufacturing costs in the power converter according to the present invention.

EMBODIMENTS FOR CARRYING OUT THE INVENTION

Embodiments of the present invention will now be described below with reference to the accompanying drawings.

First Embodiment

A power converter 100 (FIG. 1) according to a first embodiment includes a semiconductor element Z, a thermistor element TH, a current detection resistor RI, a temperature detection resistor RT, a first voltage detection unit VC1, a temperature detection unit TDC, a control unit CON, and a substrate X. The semiconductor element Z, the thermistor element TH, and the substrate X are included in a semiconductor device Y.

The substrate X includes an output node NO, a first control node N1, a second control node N2, a power supply side node NS, and a ground side node NG. The output node NO is connected to an output terminal TOUT. The power supply node NS is connected to a power supply potential VS. For example, the power supply side node NS is connected to a positive electrode of a battery (not shown) that outputs the power supply potential VS, and a negative electrode of the battery is grounded.

The semiconductor element Z is disposed on the substrate X. The semiconductor element Z includes an output A connected to the output node NO of the substrate X, a first input G1 connected to the first control node N1 of the substrate X, a second input G2 connected to the second control node N2 of the substrate X, a first drive current node D1 connected to the power supply side node NS of the substrate X, and a second drive current node D2 connected to the ground side node NG of the substrate X. A drive current for driving the semiconductor element Z flows between the first drive current node D1 and the second drive current node D2 of the semiconductor element Z.

Figure 1:
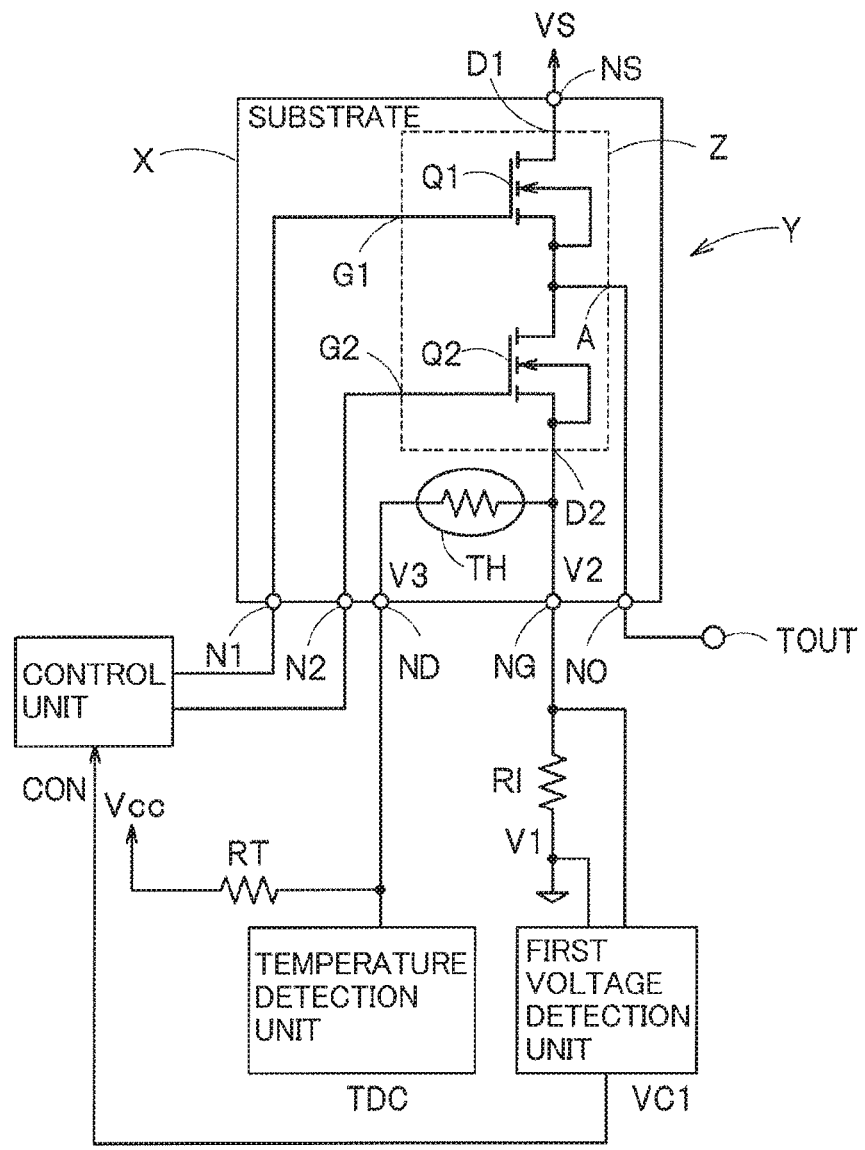
FIG. 1 is a circuit diagram illustrating an example of a configuration of a power converter 100 according to a first embodiment.

The semiconductor element Z includes, for example, a first transistor Q1 and a second transistor Q2 as shown in FIG. 1.

The first transistor Q1 has one end (drain), which is the first drive current node D1, another end (source) connected to the output A, and a gate, which is the first input G1.

The first transistor Q1 is a first NMOS transistor, in which the one end, the drain, is connected to the power supply side node NS, and the other end, the source, is connected to the output node NO.

The second transistor Q2 has one end (drain) connected to the output A, another end (source), which is the second drive current node D2, and a gate, which is the second input G2.

The second transistor Q2 is a second NMOS transistor, in which the one end, the drain, is connected to the output node NO, and the other end, the source, is connected to the ground side node NG.

For example, the first and second transistors Q1 and Q2 are included in a three-phase bridge circuit for rectifying an output voltage of a motor (not shown).

The thermistor element TH is disposed on the substrate X, and has one end that is connected to the ground side node NG, and another end that is connected to a detection node ND of the substrate X. The thermistor element TH is for detecting the temperature of the substrate X.

The current detection resistor RI has one end that is connected to the ground side node NG, and another end that is grounded. The current detection resistor RI is for detecting the drive current of the semiconductor element Z.

The first voltage detection unit VC1 detects a first potential V1 at the other end of the current detection resistor RI and a second potential V2 at the ground side node NG, and outputs a first detection signal that is dependent on a first potential difference between the first potential V1 and the second potential V2.

The temperature detection resistor RT has one end that is connected to a reference potential Vcc, and another end that is connected to the detection node ND. The temperature detection resistor RT is for detecting the temperature of the substrate X.

The resistance value of the temperature detection resistor RT is set to be greater than the resistance value of the current detection resistor RI. The resistance value of the thermistor element TH at the normal temperature is set to be greater than the resistance value of the temperature detection resistor RT.

The temperature detection unit TDC is configured to detect a temperature based on a third potential V3 at the detection node ND, and output a temperature information signal including information on the detected temperature.

In response to the first detection signal, the control unit CON outputs a first control signal to the first input G1 via the first control node N1 and a second control signal to the second input G2 via the second control node N2 to control the semiconductor element Z.

In particular, in the example shown in FIG. 1, the control unit CON outputs the first control signal to the gate of the first transistor Q1 via the first control node N1 to control the first transistor Q1, and a second control signal to the gate of the second transistor Q2 via the second control node N2 to control the second transistor Q2, based on the first detection signal.

More specifically, the control unit CON obtains a first current flowing through the current detection resistor RI in response to the first detection signal. Based on the value of the first current, the control unit CON outputs the first control signal to the gate of the first transistor Q1 via the first control node N1 to control the first transistor Q1, and outputs the second control signal to the gate of the second transistor Q2 via the second control node N2 to control the second transistor Q2.

In this case, the control unit CON controls the first and second transistors Q1 and Q2 to be complementarily turned on and off.

The control unit CON thus controls the first and second transistors Q1 and Q2 to be complementarily turned on and off by the first and second control signals in response to the first detection signal.

An example of the operation of the power converter 100 having the above-described configuration will then be described below.

For example, the first voltage detection unit VC1 detects the first potential V1 at the other end of the current detection resistor RI and the second potential V2 at the ground side node NG, and outputs the first detection signal that is dependent on the first potential difference between the first potential V1 and the second potential V2 (the potential difference across the current detection resistor RI), as described above.

The control unit CON obtains the first current flowing through the current detection resistor RI based on the first detection signal, for example.

The resistance value of the current detection resistor RI is a known value. Thus, if the first potential difference (the potential difference across the current detection resistor RI) is obtained based on the first detection signal, the first current flowing through the current detection resistor RI may be obtained by dividing the first potential difference by the resistance value of the current detection resistor RI.

Based on the value of the first current, the control unit CON outputs the first control signal to the gate of the first transistor Q1 via the first control node N1 to control the first transistor Q1, and the second control signal to the gate of the second transistor Q2 via the second control node N2 to control the second transistor Q2.

In this case, the control unit CON controls the first and second transistors Q1 and Q2 so that, for example, the first transistor Q1 and the second transistor Q2 are complementarily turned on and off based on a result of the comparison between the first current value and a predefined value.

As described above, the control unit CON controls the first and second transistors Q1 and Q2 to be complementarily turned on and off by the first and second control signals based on the first detection signal.

The temperature detection unit TDC detects the temperature based on the third potential V3 at the detection node ND, and outputs a temperature information signal including information on the detected temperature, as described above.

Specifically, for example, the temperature detection unit TDC obtains a potential difference between the third potential V3 and the ground potential. The potential difference includes the potential difference across the thermistor element TH and the potential difference across the current detection resistor RI. As described above, the resistance value of the current detection resistor RI is considerably smaller than the resistance value of the thermistor element TH.

The temperature detection unit TDC then obtains the current value of the current flowing through the thermistor element TH by dividing the potential difference between the reference potential Vcc and the third potential V3 (the potential difference across the temperature detection resistor RT) by the resistance value of the temperature detection resistor RT. The temperature detection unit TDC thereafter obtains the resistance value of the thermistor element TH by dividing the potential difference between the third potential V3 and the ground potential by the current value thus obtained. Here, the resistance value of the current detection resistor RI is ignored.

Thus, the temperature detection unit TDC detects a temperature corresponding to the obtained resistance value of the thermistor element TH, and outputs a temperature information signal including information on the detected temperature.

As described above, a power converter 100 according to an aspect of the present invention includes:

a semiconductor element Z disposed on a substrate X, the semiconductor element Z including an output A connected to an output node NO of the substrate X, a first input G1 connected to a first control node N1 of the substrate X, a second input G2 connected to a second control node N2 of the substrate X, a first drive current node D1 connected to a power supply side node NS of the substrate X, and a second drive current node D2 connected to a ground side node NG of the substrate X;

a thermistor element TH disposed on the substrate X for detecting a temperature of the substrate X, the thermistor element TH including one end connected to the ground side node NG, and another end connected to a detection node ND of the substrate X;

a current detection resistor RI having one end connected to the ground side node NG and another end connected to the ground;

a first voltage detection unit VC1 configured to detect a first potential V1 at the other end of the current detection resistor RI and a second potential V2 at the ground side node NG, and output a first detection signal based on a first potential difference between the first potential V1 and the second potential V2;

a control unit CON configured to output a first control signal to the first input G1 via the first control node N1, and a second control signal to the second input G2 via the second control node N2 based on the first detection signal to control the semiconductor element Z;

a temperature detection resistor RT having one end connected to a reference potential Vcc and another end connected to the detection node ND; and a temperature detection unit TDC configured to detect a temperature based on a third potential V3 at the detection node ND, and output a temperature information signal including information on the detected temperature.

Thus, in the power converter 100, the other end of the thermistor element TH is connected to the ground side node NG to use the ground side node NG, to which the current detection resistor RI for detecting the current flowing through the semiconductor element Z (the first and second transistors Q1 and Q2) is connected, as a node of the substrate X that is grounded to detect the voltage of the thermistor element TH.

This results in a decrease in the number of nodes in the substrate X used for detecting the voltage of the thermistor element TH (the number of nodes for the thermistor element TH is reduced to one (the detection node ND)).

Thus, the number of nodes in the substrate may be decreased to reduce the manufacturing costs in the power converter according to the present invention.

Second Embodiment

Figure 2:
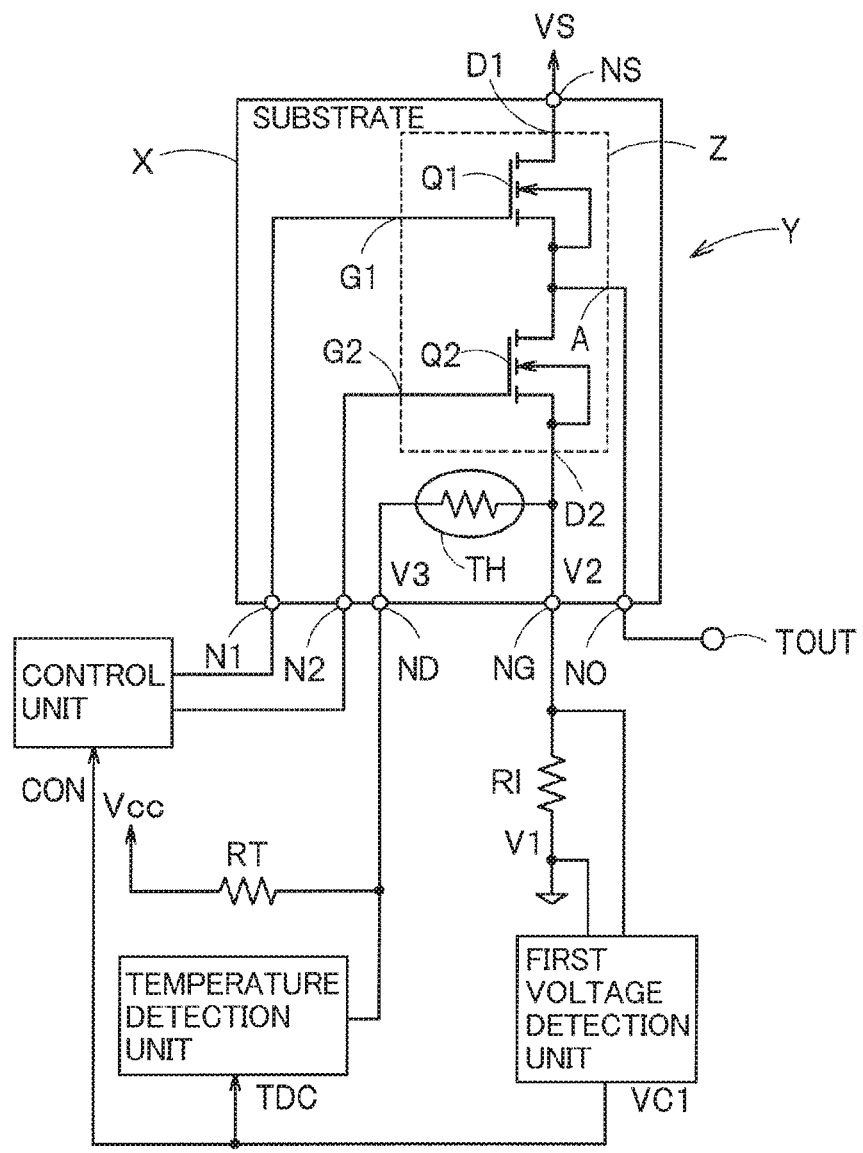
FIG. 2 is a circuit diagram illustrating an example of a configuration of a power converter 200 according to a second embodiment.

Another example of the configuration of a power converter according to a second embodiment will be described below. FIG. 2 is a circuit diagram illustrating an example of a configuration of a power converter 200 according to the second embodiment. In FIG. 2, reference numerals that are the same as those in FIG. 1 represent the same elements as those of the first embodiment. Explanation on such elements is omitted.

Like the first embodiment, the power converter 200 according to the second embodiment (FIG. 2) includes a semiconductor element Z, a thermistor element TH, a current detection resistor RI, a temperature detection resistor RT, a first voltage detection unit VC1, a temperature detection unit TDC, a control unit CON, and a substrate X.

A third potential V3 at a detection node ND and also a first detection signal are inputted to the temperature detection unit TDC. Inputting the first detection signal to the temperature detection unit TDC is a difference between the second embodiment and the first embodiment.

The temperature detection unit TDC obtains a resistance value of the thermistor element TH based on the third potential V3 and the first potential difference described above, which is a potential difference between a first potential V1 and a second potential V2, i.e., a potential difference across the current detection resistor RI. The temperature detection unit TDC then detects a temperature corresponding to the resistance value of the thermistor element TH.

More specifically, for example, the temperature detection unit TDC obtains a second potential difference (potential difference across the thermistor element TH) by subtracting the first potential difference (potential difference across the current detection resistor RI) from a potential difference between the third potential V3 and a ground potential (potential difference across the thermistor element TH and the current detection resistor RI).

The temperature detection unit TDC then obtains the current value of a current flowing through the thermistor element TH by dividing the potential difference between a reference potential Vcc and the third potential V3 (potential difference across the temperature detection resistor RT) by the resistance value of the temperature detection resistor RT. The temperature detection unit TDC further obtains the resistance value of the thermistor element TH by dividing the second potential difference (potential difference across the thermistor element TH) by the acquired current value.

The rest of the configuration of the power converter 200 is the same as that of the power converter 100 shown in FIG. 1.

The other operational characteristics of the power converter 200 having the above configuration are the same as those of the first embodiment.

Like the first embodiment, the power converter according to the second embodiment is capable of reducing the number of nodes of the substrate used to detect the voltage of the thermistor element.

Thus, the number of nodes in the substrate may be decreased to reduce the manufacturing costs in the power converter according to the present invention.

In particular, as described above, the temperature detection unit, to which the third potential at the detection node together with the first detection signal is inputted, obtains the resistance value of the thermistor element based on the third potential and the first potential difference (potential difference across the current detection resistor) and detects a temperature corresponding to the resistance value of the thermistor element.

The number of nodes of the substrate may be decreased and the temperature detection accuracy may be improved by correcting the detected voltage at the thermistor element using the first potential difference across the current detection resistor for detecting the current flowing through the semiconductor element, thereby correctly obtaining the resistance value of the thermistor element.

Third Embodiment

Figure 3:
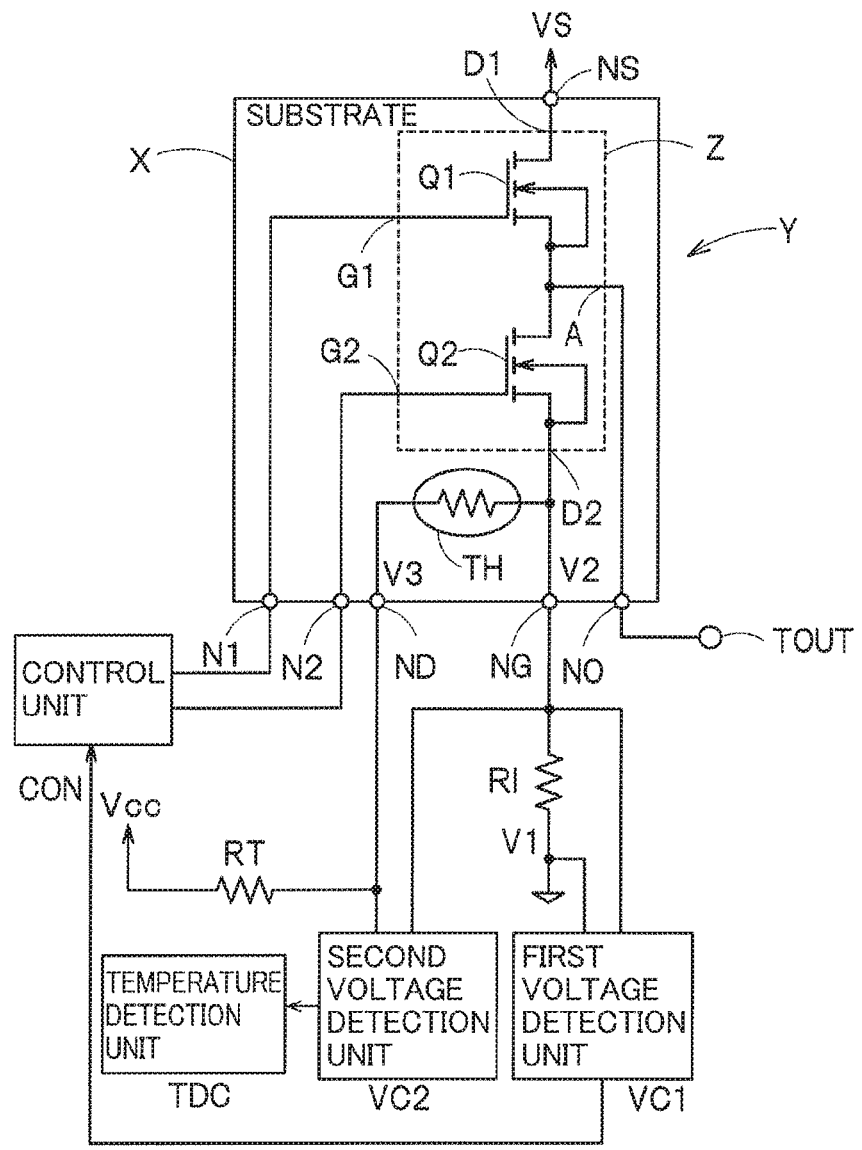
FIG. 3 is a circuit diagram illustrating an example of a configuration of a power converter 300 according to a third embodiment.

A further example of the configuration of a power converter according to a third embodiment will be described below. FIG. 3 is a circuit diagram illustrating an example of the configuration of a power converter 300 according to the third embodiment. In FIG. 3, reference numerals that are the same as those in FIG. 1 represent the same elements as those in the first embodiment. Explanation on such elements is omitted.

The power converter 300 according to the third embodiment (FIG. 3) is obtained by adding a second voltage detection unit VC2 to the power converter 100 according to the first embodiment.

The second voltage detection unit VC2 is configured to detect the second potential V2 at the ground side node NG and the third potential V3 at the detection node ND.

A signal including information on the second and third potentials V2 and V3 is inputted from the second voltage detection unit VC2 to the temperature detection unit TDC. The temperature detection unit TDC then obtains the resistance value of the thermistor element TH based on the third potential V3 and the second potential V2. The temperature detection unit TDC further detects a temperature corresponding to the resistance value of the thermistor element TH.

More specifically, for example, the temperature detection unit TDC obtains the second potential difference between the third potential V3 and the second potential V2 (potential difference across the thermistor element TH) based on the signal including information on the second and third potentials V2 and V3.

The temperature detection unit TDC then obtains the current value of the current flowing through the thermistor element TH by dividing the potential difference between the reference potential Vcc and the third potential V3 (potential difference across the temperature detection resistor RT) by the resistance value of the temperature detection resistor RT. The temperature detection unit TDC then obtains the resistance value of the thermistor element TH by dividing the second potential difference by the current value of the current flowing through the thermistor element TH.

The rest of the configuration of the power converter 300 is the same as that of the power converter 100 shown in FIG. 1.

The other operational characteristics of the power converter 300 having the above configuration are the same as those of the first embodiment.

Like the first embodiment, the power converter according to the third embodiment is capable of reducing the number of nodes of the substrate used to detect the voltage of the thermistor element.

Thus, the number of nodes in the substrate may be decreased to reduce the manufacturing costs in the power converter according to the present invention.

Fourth Embodiment

Figure 4:
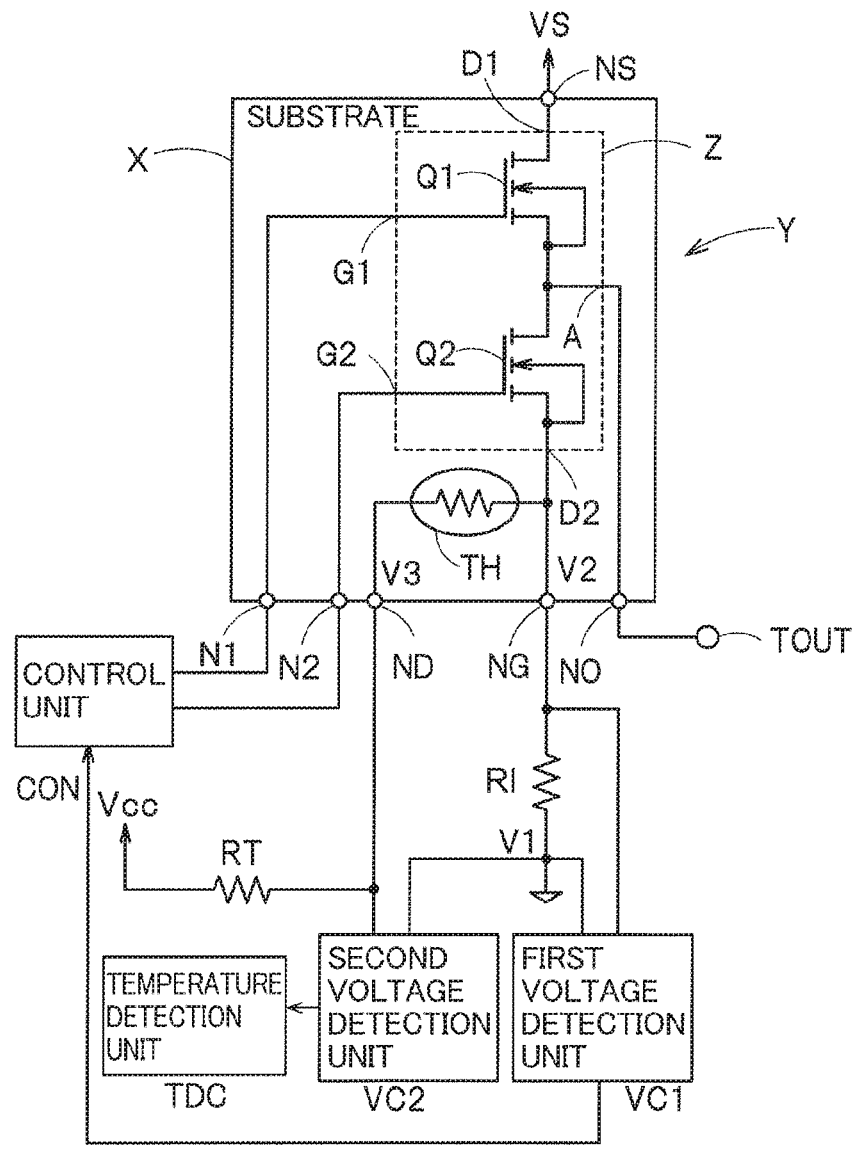
FIG. 4 is a circuit diagram illustrating an example of a configuration of a power converter 400 according to a fourth embodiment.

A still further example of the configuration of a power converter according to a fourth embodiment will be described below. FIG. 4 is a circuit diagram illustrating an example of the configuration of a power converter 400 according to the fourth embodiment. In FIG. 4, reference numerals that are the same as those in FIG. 3 represent the same elements as those in the third embodiment. Explanation on such elements is omitted.

Like the power converter 300 according to the third embodiment, the power converter 400 according to the fourth embodiment (FIG. 4) includes a semiconductor element Z, a thermistor element TH, a current detection resistor RI, a temperature detection resistor RT, a first voltage detection unit VC1, a second voltage detection unit VC2, a temperature detection unit TDC, a control unit CON, and a substrate X.

In this embodiment, the second voltage detection unit VC2 detects a first potential V1 at the other end of the current detection resistor RI and a third potential V3 at the detection node ND. The fourth embodiment differs from the third embodiment in that the second voltage detection unit VC2 detects the first potential V1 at the other end of the current detection resistor RI.

A signal including information on the first and third potentials V1 and V3 is inputted from the second voltage detection unit VC2 to the temperature detection unit TDC.

The temperature detection unit TDC then obtains the resistance value of the thermistor element TH based on the first potential V1 and the third potential V3 obtained from the signal including the information on the first and third potentials V1 and V3 to detect a temperature corresponding to the resistance value of the thermistor element TH.

Specifically, for example, the temperature detection unit TDC obtains a potential difference between the first potential V1 and the third potential V3 (potential difference across the thermistor element TH and the current detection resistor RI) from the signal including the information on the first potential V1 and the third potential V3.

The temperature detection unit TDC then obtains the current value of a current flowing through the thermistor element TH by dividing the potential difference between the reference potential Vcc and the third potential V3 by the resistance value of the temperature detection resistor RT.

The temperature detection unit TDC then obtains the resistance value of the thermistor element TH by dividing the potential difference between the third potential V3 and the first potential V1 by the obtained current value.

The rest of the configuration of the power converter 400 is the same as that of the power converter 300 shown in FIG. 3.

The other operational characteristics of the power converter 400 having the above configuration are the same as those of the third embodiment.

Like the third embodiment, the power converter according to the fourth embodiment is capable of reducing the number of nodes of the substrate used to detect the voltage of the thermistor element.

Thus, the number of nodes in the substrate may be decreased to reduce the manufacturing costs in the power converter according to the present invention.

Fifth Embodiment

Figure 5:
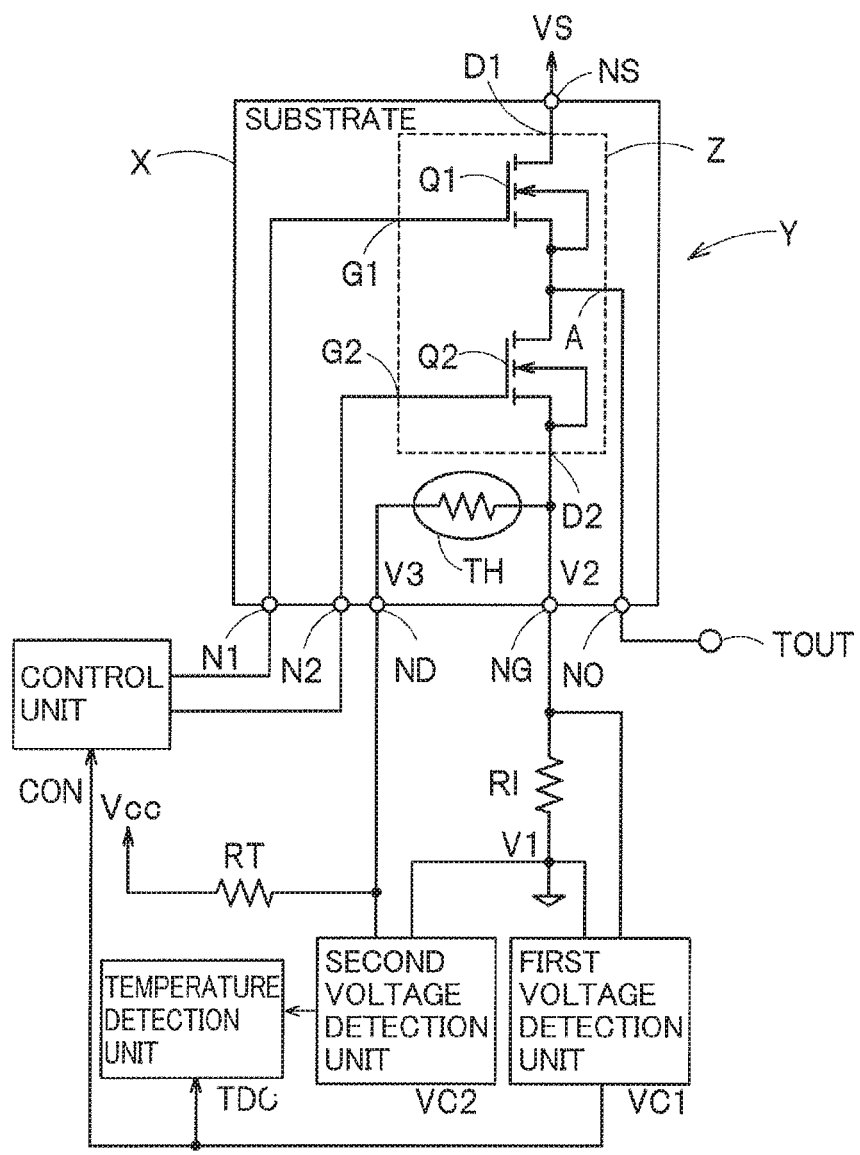
FIG. 5 is a circuit diagram illustrating an example of a configuration of a power converter 500 according to a fifth embodiment.
Figure 6:
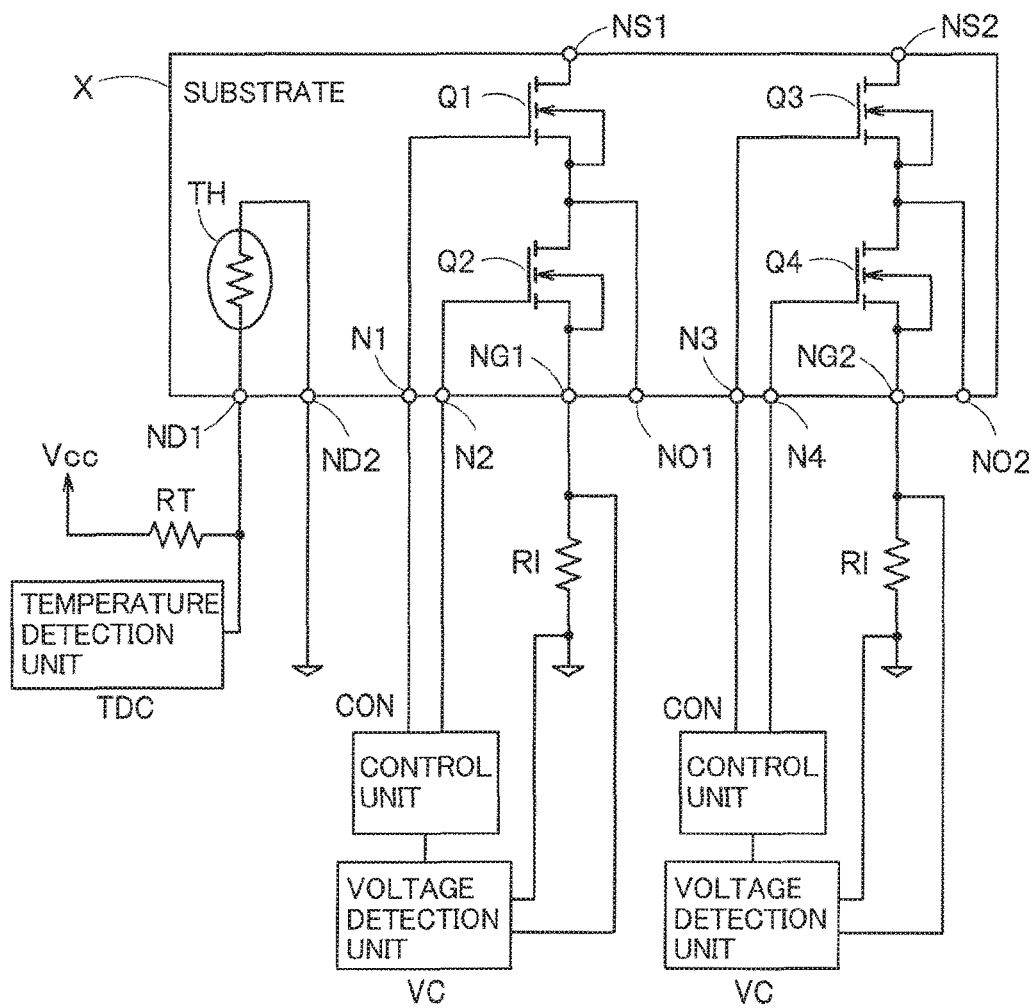
FIG. 6 is a circuit diagram illustrating a configuration of a conventional power converter 100A.

A further example of the configuration of a power converter according to a fifth embodiment will be described below. FIG. 5 is a circuit diagram illustrating an example of a configuration of a power converter 500 according to the fifth embodiment. In FIG. 5, reference numerals that are the same as those in FIG. 4 represent the same elements as those in the fourth embodiment. Explanation on such elements is omitted.

Like the fourth embodiment, the power converter 500 according to the fifth embodiment (FIG. 5) includes a semiconductor element Z, a thermistor element TH, a current detection resistor RI, a temperature detection resistor RT, a first voltage detection unit VC1, a second voltage detection unit VC2, a temperature detection unit TDC, a control unit CON, and a substrate X.

In this embodiment, the second voltage detection unit VC2 detects a first potential V1 at the other end of the current detection resistor RI and a third potential V3 at the detection node ND, as in the fourth embodiment.

A signal including information on the first and third potentials V1 and V3 is inputted from the second voltage detection unit VC2, and a first detection signal is inputted from the first voltage detection unit VC1 to the temperature detection unit TDC. The fifth embodiment differs from the fourth embodiment in that the first detection signal is inputted to the temperature detection unit TDC.

The temperature detection unit TDC obtains the resistance value of the thermistor element TH based on the first potential V1, the third potential V3, and the first potential difference. The temperature detection unit TDC further detects a temperature corresponding to the resistance value of the thermistor element TH.

More specifically, for example, the temperature detection unit TDC obtains the second potential difference (potential difference across the thermistor element TH) by subtracting the first potential difference (potential difference across the current detection resistor RI) from the potential difference between the third potential V3 and the first potential V1 (potential difference across the thermistor element TH and the current detection resistor RI).

The temperature detection unit TDC then obtains the current value of a current flowing through the thermistor element TH by dividing the potential difference between the reference potential Vcc and the third potential V3 (potential difference across the temperature detection resistor RT) by the resistance value of the temperature detection resistor RT.

The temperature detection unit TDC obtains the resistance value of the thermistor element TH by dividing the second potential difference by the current value obtained.

The rest of the configuration of the power converter 500 is the same as that of the power converter 400 shown in FIG. 4.

The other operational characteristics of the power converter 500 having the above configuration are the same as those of the fourth embodiment.

Like the fourth embodiment, the power converter according to the fifth embodiment is capable of reducing the number of nodes of the substrate used to detect the voltage of the thermistor element.

Thus, the number of nodes in the substrate may be decreased to reduce the manufacturing costs in the power converter according to the present invention.

As described above, in this embodiment, the temperature detection unit receives the third potential at the detection node and the first detection signal, obtains the resistance value of the thermistor element based on the third potential and the first potential difference (corresponding to the potential difference across the current detection resistor) corresponding to the resistance value of the thermistor element.

Thus, the number of nodes in the substrate may be decreased and the accuracy in detecting temperature may be improved by correcting the detected voltage of the thermistor element using the first potential difference of the current detection resistor for detecting the current flowing through the semiconductor element, thereby correctly obtaining the resistance value of the thermistor element.

While certain embodiments have been described, these embodiments have been presented by way of example only, and are not intended to limit the scope of the inventions. The embodiments may be embodied in a variety of other forms. Furthermore, various omissions, substitutions and changes may be made without departing from the spirit of the inventions. The embodiments and their modifications are included in the scope and the subject matter of the invention, and at the same time included in the scope of the claimed inventions and their equivalents.

The invention claimed is:

1. A power converter comprising:
a semiconductor element disposed on a substrate, the semiconductor element including an output connected to an output node of the substrate, a first input connected to a first control node of the substrate, a second input connected to a second control node of the substrate, a first drive current node connected to a power supply side node of the substrate, and a second drive current node connected to a ground side node of the substrate;
a thermistor element disposed on the substrate for detecting a temperature of the substrate, the thermistor element having one end that is connected to the ground side node, and another end that is connected to a detection node of the substrate;
a current detection resistor having one end that is connected to the ground side node and another end that is grounded;
a first voltage detection unit configured to detect a first potential at the other end of the current detection resistor and a second potential at the ground side node, and output a first detection signal in accordance with a first potential difference between the first potential and the second potential;
a control unit configured to output, based on the first detection signal, a first control signal to the first input via the first control node and a second control signal to the second input via the second control node to control the semiconductor element;
a temperature detection resistor having one end that is connected to a reference potential, and another end that is connected to the detection node; and
a temperature detection unit configured to detect a temperature based on a third potential at the detection node, and output a temperature information signal including information on the temperature detected,
wherein the semiconductor element includes:
a first transistor having one end that is the first drive current node, another end connected to the output, and a gate that is the first input; and
a second transistor having one end that is connected to the output, another end that is the second drive current node, and a gate that is the second input,
and wherein
based on the first detection signal, the control unit outputs the first control signal to the gate of the first transistor via the first control node to control the first transistor, and the second control signal to the gate of the second transistor via the second control node to control the second transistor,
wherein a resistance value of the temperature detection resistor is greater than a resistance value of the current detection resistor, and a resistance value of the thermistor element at a normal temperature is greater than the resistance value of the temperature detection resistor.

2. The power converter according to claim 1, wherein the temperature detection unit receives the third potential at the detection node and the first detection signal, and obtains the resistance value of the thermistor element based on the third potential and the first potential difference to detect a temperature corresponding to the resistance value of the thermistor element.

3. The power converter according to claim 2, wherein the temperature detection unit obtains: a second potential difference by subtracting the first potential difference from a potential difference between the third potential and a ground potential; a current value of a current flowing through the thermistor element by dividing a potential difference between the reference potential and the third potential by the resistance value of the temperature detection resistor; and the resistance value of the thermistor element by dividing the second potential difference by the current value.

4. The power converter according to claim 1, further comprising a second voltage detection unit configured to detect the second potential at the ground side node and the third potential at the detection node, wherein the temperature detection unit: receives a signal including information on the second potential and the third potential from the second voltage detection unit; obtains the resistance value of the thermistor element based on the third potential and the second potential; and detects a temperature corresponding to the resistance value of the thermistor element.

5. The power converter according to claim 4, wherein the temperature detection unit obtains: a second potential difference between the third potential and the second potential; a current value of a current flowing through the thermistor element by dividing a potential difference between the reference potential and the third potential by the resistance value of the temperature detection resistor; and the resistance value of the thermistor element by dividing the second potential difference by the current value of the current flowing through the thermistor element.

6. The power converter according to claim 1, further comprising a second voltage detection unit configured to detect the first potential at the other end of the current detection resistor and the third potential at the detection node, wherein the temperature detection unit: receives a signal including information on the first potential and the third potential from the second voltage detection unit; and obtains the resistance value of the thermistor element based on the first potential and the third potential, and detects a temperature corresponding to the resistance value of the thermistor element.

7. The power converter according to claim 6, wherein the temperature detection unit obtains: a potential difference between the third potential and the first potential; a current value of a current flowing through the thermistor element by dividing a potential difference between the reference potential and the third potential by the resistance value of the temperature detection resistor; and the resistance value of the thermistor element by dividing the potential difference between the third potential and the first potential by the current value.

8. The power converter according to claim 1, further comprising a second voltage detection unit configured to detect the first potential at the other end of the current detection resistor and the third potential at the detection node, wherein the temperature detection unit: receives a signal including information on the first potential and the third potential from the second voltage detection unit and the first detection signal; obtains the resistance value of the thermistor element based on the first potential, the third potential, and the first potential difference; and detects a temperature corresponding to the resistance value of the thermistor element.

9. The power converter according to claim 8, wherein the temperature detection unit obtains: a second potential difference by subtracting the first potential difference from a potential difference between the third potential and the first potential; a current value of a current flowing through the thermistor element by dividing a potential difference between the reference potential and the third potential by the resistance value of the temperature detection resistor; and the resistance value of the thermistor element by dividing the second potential difference by the current value.

10. The power converter according to claim 1, wherein the control unit:
obtains a first current flowing through the current detection resistor based on the first detection signal; and
based on a value of the first current, outputs the first control signal to the gate of the first transistor via the first control node to control the first transistor, and the second control signal to the gate of the second transistor via the second control node to control the second transistor.

11. The power converter according to claim 1, wherein:
the first transistor is a first NMOS transistor having a drain that is the one end of the first transistor, the drain being connected to the power supply side node, and a source that is the other end of the first transistor, the source being connected to the output node; and
the second transistor is a second NMOS transistor having a drain that is the one end of the second transistor, the drain being connected to the output node, and a source that is the other end of the second transistor, the source being connected to the ground side node.

12. The power converter according to claim 1, wherein the power supply node is connected to a power supply potential.

* * * * *